United States Patent
Lee

(10) Patent No.: US 10,043,449 B2
(45) Date of Patent: Aug. 7, 2018

(54) ORGANIC LIGHT-EMITTING DIODE DISPLAY

(71) Applicant: Samsung Display Co., Ltd., Yongin-si, Gyeonggi-do (KR)

(72) Inventor: Kwang Sae Lee, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 78 days.

(21) Appl. No.: 15/080,375

(22) Filed: Mar. 24, 2016

(65) Prior Publication Data

US 2016/0321994 A1 Nov. 3, 2016

(30) Foreign Application Priority Data

Apr. 29, 2015 (KR) .................. 10-2015-0060610

(51) Int. Cl.
*G09G 3/32* (2016.01)
*G09G 3/3258* (2016.01)
(Continued)

(52) U.S. Cl.
CPC ......... *G09G 3/3258* (2013.01); *G09G 3/2003* (2013.01); *G09G 3/3233* (2013.01);
(Continued)

(58) Field of Classification Search
CPC .. G09G 3/3258; G09G 3/2003; G09G 3/3233; G09G 3/3275; G09G 2300/0426; G09G 2300/0861; G09G 2310/0251; G09G 2310/0262; G09G 2320/0209; G09G 2320/0214; H01L 27/3248; H01L 27/3218; H01L 27/3262; H01L 27/3265
See application file for complete search history.

(56) References Cited

U.S. PATENT DOCUMENTS

| 2013/0257839 | A1* | 10/2013 | Hyeon | G06F 3/038 345/212 |
| 2014/0097440 | A1* | 4/2014 | Jeon | H01L 27/1251 257/72 |
| 2015/0035734 | A1* | 2/2015 | Lee | G09G 3/3258 345/76 |

FOREIGN PATENT DOCUMENTS

KR 10-2013-0060603 A 6/2013
KR 10-2014-0077002 A 6/2014
(Continued)

*Primary Examiner* — Sahlu Okebato
(74) *Attorney, Agent, or Firm* — Knobbe Martens Olson & Bear LLP

(57) ABSTRACT

An organic light-emitting diode (OLED) display is disclosed. In one aspect, the display includes a plurality of pixels and a data line formed adjacent to the pixels and configured to transfer a data voltage. The display also includes a driving voltage line formed substantially parallel to the data line and configured to transfer a driving voltage, and an initialization voltage line formed substantially parallel to the data line and configured transfer an initialization voltage. At least one of the pixels includes a driving transistor including a driving gate electrode and configured to receive the initialization voltage from the initialization voltage line. A driving connector is spaced apart from the data line and electrically connected to the driving gate electrode. An OLED is electrically connected to the driving transistor, at least one of the initialization voltage line and the driving voltage line interposed between the driving connector and the data line.

18 Claims, 8 Drawing Sheets

(51) Int. Cl.
    *G09G 3/20*     (2006.01)
    *G09G 3/3233*     (2016.01)
    *G09G 3/3275*     (2016.01)
    *H01L 27/32*     (2006.01)

(52) U.S. Cl.
CPC ....... *G09G 3/3275* (2013.01); *H01L 27/3218* (2013.01); *H01L 27/3248* (2013.01); *H01L 27/3262* (2013.01); *H01L 27/3265* (2013.01); *H01L 27/3276* (2013.01); *G09G 2300/0426* (2013.01); *G09G 2300/0861* (2013.01); *G09G 2310/0251* (2013.01); *G09G 2310/0262* (2013.01); *G09G 2320/0209* (2013.01); *G09G 2320/0214* (2013.01)

(56) References Cited

FOREIGN PATENT DOCUMENTS

| | | |
|---|---|---|
| KR | 10-2014-0108023 A | 9/2014 |
| KR | 10-2014-0130904 A | 11/2014 |

\* cited by examiner

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2015-0060610 filed in the Korean Intellectual Property Office on Apr. 29, 2015, the entire contents of which are incorporated herein by reference.

BACKGROUND

Field

The described technology generally relates to an organic light-emitting diode display.

Description of the Related Technology

In an organic light-emitting diode (OLED), an electron is injected from a cathode electrode and a hole is injected from an anode electrode which are coupled with each other in an organic emission layer to generate an exciton, thereby emitting light and energy from the exciton. Many of these electron and hole interactions result in the full light of a pixel.

The OLED display includes a matrix of pixels each including a plurality of transistors and capacitors for driving the OLED. The transistors typically includes a switching transistor and a driving transistor.

The driving transistor controls a driving current flowing to the OLED and stores a data voltage in a storage capacitor connected to a driving gate node of the driving transistor to maintain the data voltage for one frame. Accordingly, in the driving transistor during that one frame, light is emitted by supplying a predetermined amount of driving current to the OLED.

However, due to a parasitic capacitance formed between a driving gate node connected to a driving gate electrode of the driving transistor and a data line, a voltage change of the data line influences a voltage of the driving gate node. Vertical crosstalk in which a voltage change of the driving gate node changes driving current flowing in the OLED to generate a luminance change occurs.

In order to prevent vertical crosstalk, the distance between the data line and the driving gate node is made as large as possible, but in a high-resolution device, the size of the pixel is smaller. Thus, process design rules do not proportionally decrease due to equipment specifications and limitations of the photolithography process capacity. As a result, with increasing display resolutions requiring smaller and smaller pixels, there is a limitation in minimizing the vertical crosstalk.

The above information disclosed in this Background section is only for enhancement of understanding of the background of the described technology and therefore it may contain information that does not constitute the prior art that is already known in this country to a person of ordinary skill in the art.

SUMMARY OF CERTAIN INVENTIVE ASPECTS

One inventive aspect relates to an OLED display that can minimize a vertical crosstalk in a high-resolution structure.

Another aspect is an OLED display including: a substrate; a plurality of scan lines formed on the substrate and transferring scan signals; a plurality of data lines crossing the scan lines and transferring data voltages; a driving voltage line crossing the scan lines and transferring a driving voltage; an initialization voltage line crossing the scan lines and transferring an initialization voltage; and a plurality of pixels formed at a plurality of points where the scan lines and the data lines cross each other, in which at least one pixel among the plurality of pixels includes a switching transistor connected to the scan line and the data line, a driving transistor connected to the switching transistor and to which the initialization voltage is supplied from the initialization voltage line, a driving connecting member connected to a driving gate electrode of the driving transistor, and an OLED electrically connected to the driving transistor, and the driving connecting member is spaced apart from the data line with any one of the initialization voltage line and the driving voltage line therebetween.

The plurality of pixels may include a first pixel and a second pixel adjacent to the first pixel, the data lines may include a first data line transferring a first data voltage to the first pixel and a second data line transferring a second data voltage to the second pixel, the first data line may be spaced apart from the driving connecting member with any one of the initialization voltage line and the driving voltage line therebetween, and the second data line may be spaced apart from the driving connecting member of the first pixel with the other one of the initialization voltage line and the driving voltage line therebetween.

The plurality of pixels may include a first pixel and a second pixel which emit light having different colors, and a third pixel disposed between the first pixel and second pixel, the driving voltage line may be disposed between the first pixel and the third pixel, and the initialization voltage line may be disposed between the second pixel and the third pixel.

The data lines may include a first data line, a second data line, and a third data line transferring a first data signal, a second data signal, and a third data signal to the first pixel, the second pixel, and the third pixel, respectively, the driving voltage line may be disposed between the driving connecting member of the third pixel and the third data line, and the initialization voltage line may be disposed between the driving connecting member of the third pixel and the second data line.

The OLED display may further include a fourth pixel emitting the same color light as the third pixel, in which the second pixel is disposed between the third pixel and the fourth pixel.

The data lines may include a first data line, a second data line, a third data line and a fourth data line which transfer a first data signal, a second data signal, a third data signal, and a fourth data signal to the first pixel, the second pixel, the third pixel, and the fourth pixel, respectively, the driving voltage lines may include a first driving voltage line, a second driving voltage line, a third driving voltage line and a fourth driving voltage line which transfer the driving voltage to the first pixel, the second pixel, the third pixel, and the fourth pixel, the initialization voltage line may include a first initialization voltage line and a second initialization voltage line supplying the initialization voltage to the third pixel and the fourth pixel, the third driving voltage line is disposed between the driving connecting member of the third pixel and the third data line, the first initialization voltage line may be disposed between the driving connecting member of the third pixel and the second data line, and the third driving voltage line may be disposed between the driving connecting member of the fourth pixel and the fourth data line, and the driving connecting member of the fourth pixel may be disposed between the fourth driving voltage line and the second initialization voltage line.

The OLED display may further include a fourth pixel emitting the same color light as the first pixel, in which the second pixel is disposed between the third pixel and the fourth pixel.

Any one of the first pixel and the second pixel may be a red light emission pixel, the other pixel may be a blue light emission pixel, and the third pixel may be a green light emission pixel.

The plurality of pixels may include a first pixel and a second pixel which emit light having different colors, and a third pixel disposed between the first pixel and second pixel, the driving voltage lines may include a first driving voltage line, a second driving voltage line, and a third driving voltage line which supply the driving voltage to the first pixel, the second pixel, and the third pixel, respectively, the data lines may include a first data line, a second data line, and a third data line which supply a first data voltage, a second data voltage, and a third data voltage to the first pixel, the second pixel, and the third pixel, respectively, the initialization voltage lines may include a first initialization voltage line, a second initialization voltage line, and a third initialization voltage line which supply the initialization voltage to the first pixel, the second pixel, and the third pixel, respectively, and the driving connecting member of the first pixel may be disposed between the first driving voltage line and the first initialization voltage line, the driving connecting member of the second pixel may be disposed between the second driving voltage line and the second initialization voltage line, and the driving connecting member of the third pixel may be disposed between the third driving voltage line and the third initialization voltage line.

The driving connecting member, the initialization voltage line, the driving voltage line, and the data line may be formed on the same layer.

The driving connecting member may be disposed between the initialization voltage line and the driving voltage line.

The OLED display may further include a gate insulating layer formed on the substrate; a first storage electrode formed on the gate insulating layer and forming a gate electrode of the driving transistor; a first interlayer insulating layer covering the gate insulating layer and the first storage electrode; a second storage electrode formed on the interlayer insulating layer and overlapping the first storage electrode; and a second interlayer insulating layer covering the second storage electrode and the interlayer insulating layer, in which the driving connecting member, the initialization voltage line, and the driving voltage line may be formed on the second interlayer insulating layer.

The driving connecting member may be connected to the first storage electrode through a contact hole passing through the second storage electrode while being insulated from the second storage electrode.

The OLED display may further include a compensation transistor compensating for a threshold voltage of the driving transistor and connected to the driving drain electrode of the driving transistor, in which the driving connecting member may connect the compensation drain electrode of the compensation transistor and the driving gate electrode to each other.

The OLED display may further include a semiconductor formed on the substrate and including a switching channel of the switching transistor and a driving channel of the driving transistor which are spaced apart from each other, in which the driving channel may overlap the driving gate electrode and the driving channel is curved on a plane.

Another aspect is an organic light-emitting diode (OLED) display, comprising: a substrate; a plurality of scan lines formed over the substrate and configured to transfer a scan signal; a plurality of data lines crossing the scan lines and configured to transfer a plurality of data voltages; a driving voltage line crossing the scan lines and configured to transfer a driving voltage; an initialization voltage line crossing the scan lines and configured to transfer an initialization voltage; and a plurality of pixels formed where the scan lines and the data lines cross. At least one of the pixels includes: a switching transistor electrically connected to the corresponding scan and data lines; a driving transistor electrically connected to the switching transistor and configured to receive the initialization voltage from the initialization voltage line; a driving connector electrically connected to a driving gate electrode of the driving transistor; and an OLED electrically connected to the driving transistor, wherein the driving connector is spaced apart from the data lines, and wherein one of the initialization voltage line and the driving voltage line is interposed between the driving connector and the corresponding data line.

In the above OLED display, the data voltages include first to third data voltages, wherein the pixels include a first pixel and a second pixel adjacent to the first pixel, wherein the data lines include a first data line configured to transfer the first data voltage to the first pixel and a second data line configured to transfer the second data voltage to the second pixel, wherein the first data line is spaced apart from the driving connector with one of the initialization voltage line and the driving voltage line interposed therebetween, and wherein the second data line is spaced apart from the driving connector of the first pixel with the other one of the initialization voltage line and the driving voltage line interposed therebetween.

In the above OLED display, the pixels includes a first pixel and a second pixel configured to emit light having different colors, and a third pixel formed between the first pixel and second pixel, wherein the driving voltage line is formed between the first and third pixels, and wherein the initialization voltage line is formed between the second and third pixels.

In the above OLED display, the data lines include first to third data lines configured to respectively transfer first to third data signals to the first to third pixels, wherein the driving voltage line is formed between the driving connector of the third pixel and the third data line, and wherein the initialization voltage line is formed between the driving connector of the third pixel and the second data line.

The above OLED display further comprises a fourth pixel configured to emit light of the same color as the third pixel, wherein the second pixel is formed between the third and fourth pixels.

In the above OLED display, the data lines include first to fourth data lines configured respectively transfer first to fourth data signals to the first to fourth pixels, wherein the driving voltage lines include first to fourth driving voltage lines configured to respectively transfer the driving voltage to the first to fourth pixels, wherein the initialization voltage line includes first and second initialization voltage lines configured to respectively supply the initialization voltage to the third and fourth pixels, wherein the third driving voltage line is formed between the driving connector of the third pixel and the third data line, wherein the first initialization voltage line is formed between the driving connector of the third pixel and the second data line, wherein the third driving voltage line is formed between the driving connector of the fourth pixel and the fourth data line, and wherein the driving connector of the fourth pixel is formed between the fourth driving voltage line and the second initialization voltage line.

The above OLED display further comprises a fourth pixel configured to emit light of the same color as the first pixel, wherein the second pixel is formed between the third and fourth pixels.

In the above OLED display, one of the first and second pixels includes a red light emission pixel, wherein the other pixel includes a blue light emission pixel, and wherein the third pixel is a green light emission pixel.

In the above OLED display, the pixels includes first and second pixels configured to emit light having different colors, and a third pixel formed between the first and second pixels, wherein the driving voltage lines include first to third driving voltage lines configured to respectively supply the driving voltage to the first to third pixels, wherein the data lines include first to third data lines configured to respectively supply the first to third data voltages to the first to third pixels, wherein the initialization voltage lines include first to third initialization voltage lines configured to respectively supply the initialization voltage to the first to third pixels, wherein the driving connector of the first pixel is formed between the first driving voltage line and the first initialization voltage line, wherein the driving connector of the second pixel is formed between the second driving voltage line and the second initialization voltage line, and wherein the driving connector of the third pixel is formed between the third driving voltage line and the third initialization voltage line.

In the above OLED display, the driving connector, the initialization voltage line, the driving voltage line, and the data lines are formed on the same layer.

In the above OLED display, the driving connector is formed between the initialization voltage line and the driving voltage line.

The above OLED display further comprises: a gate insulating layer formed over the substrate; a first storage electrode formed over the gate insulating layer and configured to function as a gate electrode of the driving transistor; a first interlayer insulating layer covering the gate insulating layer and the first storage electrode; a second storage electrode formed over the interlayer insulating layer and overlapping the first storage electrode in the depth dimension of the OLED display; and a second interlayer insulating layer covering the second storage electrode and the interlayer insulating layer, wherein the driving connector, the initialization voltage line, and the driving voltage line are formed over the second interlayer insulating layer.

In the above OLED display, the driving connector is electrically connected to the first storage electrode via a contact hole passing through the second storage electrode, and wherein the driving connector is electrically insulated from the second storage electrode.

The above OLED display further comprises a compensation transistor configured to compensate a threshold voltage of the driving transistor and electrically connected to the driving drain electrode of the driving transistor, wherein the driving connector is configured to electrically connect the compensation drain electrode of the compensation transistor to the driving gate electrode.

The above OLED display further comprises a semiconductor formed over the substrate and including a switching channel of the switching transistor and a driving channel of the driving transistor which are spaced apart from each other, wherein the driving channel overlaps the driving gate electrode in the depth dimension of the OLED display, and wherein the driving channel is non-linear.

Another aspect is an organic light-emitting diode (OLED) display, comprising: a plurality of pixels; a data line formed adjacent to the pixels and configured to transfer a data voltage; a driving voltage line formed substantially parallel to the data line and configured to transfer a driving voltage; and an initialization voltage line formed substantially parallel to the data line and configured transfer an initialization voltage. At least one of the pixels includes: a driving transistor including a driving gate electrode and configured to receive the initialization voltage from the initialization voltage line; a driving connector spaced apart from the data line and electrically connected to the driving gate electrode; and an OLED electrically connected to the driving transistor, wherein at least one of the initialization voltage line and the driving voltage line is interposed between the driving connector and the data line.

The OLED display of claim 16, wherein the data line includes first to third data lines substantially parallel to each other, and wherein the initialization voltage line is interposed between the driving connector and the third data line.

In the above OLED display, the driving voltage line is interposed between the driving connector and the first data line.

In the above OLED display, the driving connector, the first data line, and the initialization voltage line are spaced apart from one another.

In the above OLED display, the driving connector, the third data line, and the driving voltage line are spaced apart from one another.

According to at least one of the disclosed embodiments, an initialization voltage line or a driving voltage line which is a conductor is disposed between a driving connecting member and a data line, and as a result, a parasitic capacitor between the driving connecting member and the data line is reduced to minimize a change of the driving gate voltage due to the data voltage and a vertical crosstalk due to the minimized change of the driving gate voltage.

Further, since the data voltage may be increased by minimizing a kickback voltage due to the parasitic capacitor, a driving range of a driving gate-source voltage between the driving gate electrode connected to the driving connecting member and the driving source electrode may be increased. Therefore, grays of light emitted from the OLED may be more finely controlled, and as a result, a resolution of the OLED display may be enhanced and display quality may be improved.

DETAILED DESCRIPTION OF CERTAIN INVENTIVE EMBODIMENTS

Figure 1:
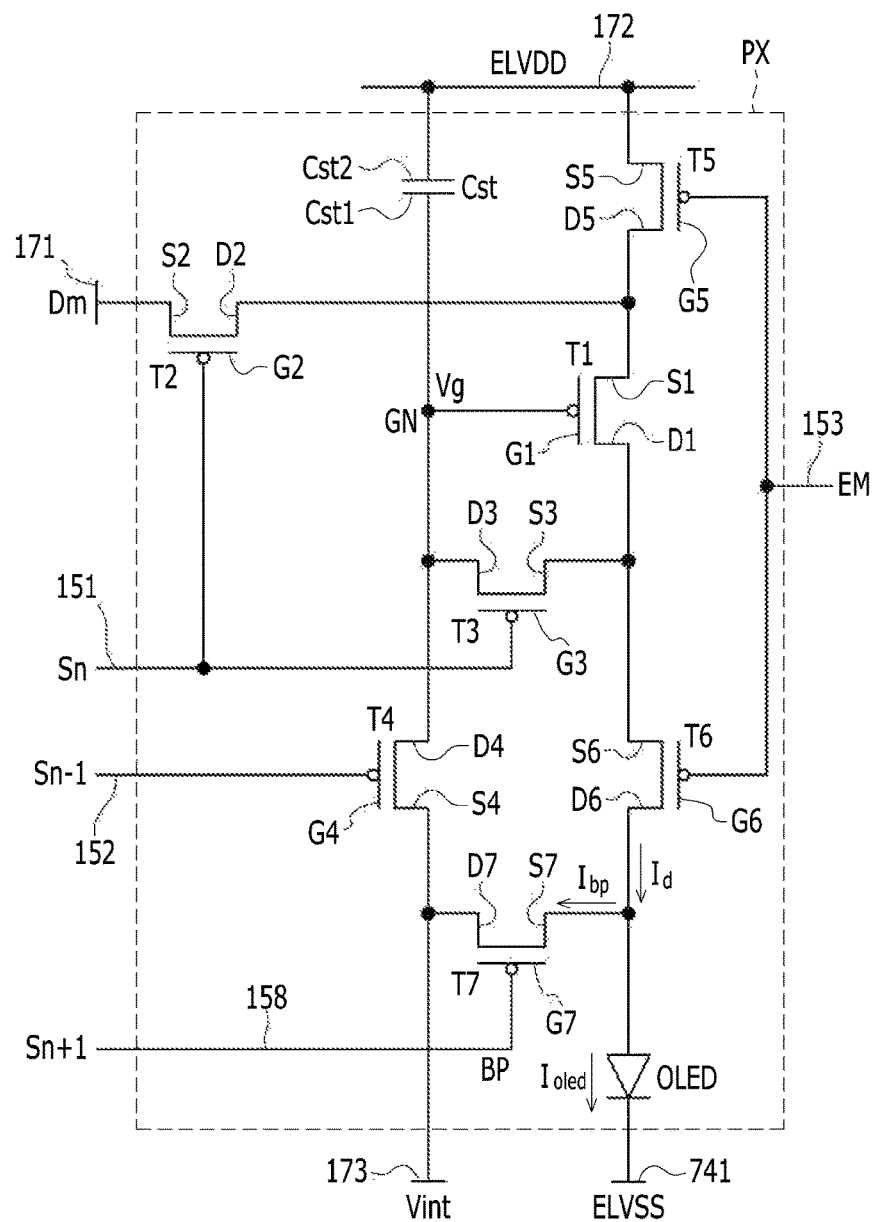
FIG. 1 is an equivalent circuit diagram illustrating one pixel of an OLED display according to an exemplary embodiment.

The described technology will be described more fully hereinafter with reference to the accompanying drawings, in which exemplary embodiments of the described technology are shown. As those skilled in the art would realize, the described embodiments may be modified in various different ways, all without departing from the spirit or scope of the described technology.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the described technology is not limited thereto. In the drawings, the thickness of layers, films, panels, regions, etc., are exaggerated for clarity. In the drawings, for understanding and ease of description, the thickness of some layers and areas is exaggerated.

Throughout the specification and the claims, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

Further, throughout the specification, the word "on a plane" means viewing a target portion from the top, and the word "on a cross section" means viewing a cross section formed by vertically cutting a target portion from the side. In this disclosure, the term "substantially" includes the meanings of completely, almost completely or to any significant degree under some applications and in accordance with those skilled in the art. The term "connected" can include an electrical connection.

Further, the numbers of thin film transistors (TFTs) and capacitors are not limited to those illustrated in the accompanying drawing, and the OLED display may include a plurality of transistors and one or more capacitors in one pixel, and a separate wire is further formed or an existing wire is omitted such that the OLED display may have various structures. Here, the pixel is a minimum unit of displaying an image, and the OLED display displays an image through the plurality of pixels.

Hereinafter, an OLED display according to an exemplary embodiment will be described in detail with reference to the accompanying drawings.

FIG. 1 is an equivalent circuit diagram illustrating one pixel of an OLED display according to an exemplary embodiment.

As illustrated in FIG. 1, the OLED display according to the exemplary embodiment includes a plurality of signal lines 151, 152, 153, 158, 171, 172, and 173, and a plurality of pixels PX which are connected to the signal lines and arranged substantially in a matrix form.

One pixel PX includes a plurality of transistors T1, T2, T3, T4, T5, T6, and T7 connected to the signal lines 151, 152, 153, 158, 171, 172, and 173, a storage capacitor Cst, and an OLED.

The plurality of transistors T1, T2, T3, T4, T5, T6, and T7 include a driving transistor T1, a switching transistor T2, a compensation transistor T3, an initialization transistor T4, an operation control transistor T5, and a light emission control transistor T6, and a bypass transistor T7.

The signal lines 151, 152, 153, 158, 171, 172, and 173 include a scan line 151 transferring a scan signal Sn, a previous scan line 152 transferring a previous scan signal Sn−1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and formed to be substantially parallel with the data line 171, and an initialization voltage line 173 transferring an initialization voltage Vint initializing the driving transistor T1.

A gate electrode G1 of the driving thin film transistor T1 is connected to one end Cst1 of the storage capacitor Cst, and a source electrode S1 of the driving thin film transistor T1 is connected to the driving voltage line 172 via the operation control thin film transistor T5. A drain electrode D1 of the driving transistor T1 is electrically connected to an anode of the OLED via the emission control thin film transistor T6. The driving transistor T1 receives the data signal Dm according to a switching operation of the switching transistor T2 to supply a driving current Id to the OLED.

A gate electrode G2 of the switching transistor T2 is connected to the scan line 151, and a source electrode S2 of the switching transistor T2 is connected to the data line 171 A drain electrode D2 of the switching transistor T2 is connected to the source electrode S1 of the driving transistor T1 and substantially simultaneously (or concurrently) connected to the driving voltage line 172 via the operation control transistor T5. The switching transistor T2 is turned on according to the scan signal Sn received through the scan line 151 to perform a switching operation that transfers the data signal Dm transferred to the data line 171 to the source electrode S1 of the driving transistor T1.

A gate electrode G3 of the compensation transistor T3 is connected to the scan line 151. A source electrode S3 of the compensation transistor T3 is connected to the drain electrode D1 of the driving transistor T1 and substantially simultaneously (or concurrently) connected to an anode of the OLED via the light emission control transistor T6. A drain electrode D3 of the compensation transistor T3 is connected to the drain electrode D4 of the initialization transistor T4, one end Cst1 of the storage capacitor Cst, and the gate electrode G1 of the driving transistor T1. The compensation transistor T3 is turned on according to the scan signal Sn received through the scan line 151 and connects the gate electrode G1 and the drain electrode D1 of the driving transistor T1 to diode-connect the driving transistor T1.

A gate electrode G4 of the initialization transistor T4 is connected to the previous scan line 152, and a source electrode S4 of the initialization transistor T4 is connected to the initialization voltage line 173. A drain electrode D4 of the initialization transistor T4 is substantially simultaneously (or concurrently) connected to one end Cst1 of the storage capacitor Cst and the gate electrode G1 of the driving transistor T1 via the drain electrode D3 of the compensation transistor T3. The initialization transistor T4 is turned on according to the previous scan signal Sn−1 received through the previous scan line 152 to transfer the initialization voltage Vint to the gate electrode G1 of the driving transistor T1 and then perform an initialization operation of initializing a gate voltage Vg of the gate electrode G1 of the driving transistor T1.

A gate electrode G5 of the operation control transistor T5 is connected to the light emission control line 153, and a source electrode S5 of the operation control transistor T5 is connected to the driving voltage line 172. A drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 153, and a source electrode S6 of the light emission control transistor T6 is connected to the drain electrode D1 of the driving transistor T1 and the source electrode S3 of the compensation transistor T3. A drain electrode D6 of the light emission control transistor T6 is electrically connected to an anode of the OLED. The operation control transistor T5 and the light emission control transistor T6 are substantially simultaneously (or concurrently) turned on according to the light emission control signal EM received through the light emission control line 153, and as a result, the driving voltage ELVDD is compensated through the diode-connected driving transistor T1 to be transferred to the OLED.

A gate electrode G7 of the bypass transistor T7 is connected to the bypass control line 158, and a source electrode S7 of the bypass transistor T7 is connected together to the drain electrode D6 of the light emission control transistor T6 and the anode of the OLED. A drain electrode D7 of the bypass transistor T7 is connected together to the initialization voltage line 173 and the source electrode S4 of the initialization transistor T4.

The bypass transistor T7 receives the bypass signal Sn+1 from the bypass control line 158. Accordingly, a part of the driving current Id is discharged through the bypass transistor T7 at a bypass current Ibp.

The other end Cst2 of the storage capacitor Cst is connected to the driving voltage line 172, and a cathode of the OLED is connected to a common voltage line 741 transferring the common voltage ELVSS.

In the exemplary embodiment, seven transistors including the bypass transistor T7 and one capacitor is illustrated, but the described technology is not limited thereto, and the number of transistors and the number of capacitors may be variously modified.

Hereinafter, a detailed operation process of one pixel of the OLED display according to the exemplary embodiment will be described in detail with reference to FIG. 2.

Figure 2:
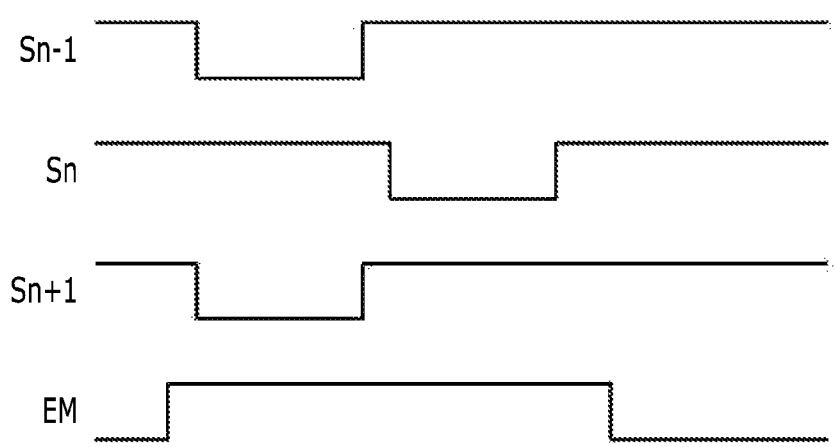
FIG. 2 is a timing diagram of a signal applied to one pixel in the OLED display according to the exemplary embodiment.

FIG. 2 is a timing diagram of a signal applied to one pixel in the OLED display according to the exemplary embodiment.

As illustrated in FIG. 2, first, for an initializing period, the previous scan signal Sn−1 at a low level is supplied through the previous scan line 152. Then, the initialization transistor T4 is turned on in response to the previous scan signal Sn−1 at the low level, the initialization voltage Vint is connected to the gate electrode G1 of the driving transistor T1 through the initialization transistor T4 from the initialization voltage line 173, and the driving transistor T1 is initialized by the initialization voltage Vint.

Thereafter, for a data programming period, the scan signal Sn at the low level is supplied through the scan line 151. Then, the switching transistor T2 and the compensation transistor T3 are turned on in response to the scan signal Sn at the low level. In this case, the driving transistor T1 is diode-connected by the turned-on compensation transistor T3 and biased in a forward direction.

Then, a compensation voltage Dm+Vth (Vth is a negative (−) value), which is the data signal Dm supplied from the data line 171 reduced by a threshold voltage Vth of the driving transistor T1, is applied to the gate electrode G1 of the driving transistor T1. For example, the gate voltage Vg applied to the gate electrode G1 of the driving transistor T1 becomes the compensation voltage Dm+Vth.

The driving voltage ELVDD and the compensation voltage Dm+Vth are applied to both ends of the storage capacitor Cst, and a charge corresponding to a voltage difference between both ends is stored in the storage capacitor Cst.

Thereafter, for the emission period, the light emission control signal EM supplied from the light emission control line 153 is changed from the high level to the low level. Then, for the light emission period, the operation control transistor T5 and the light emission control transistor T6 are turned on by the light emission control signal EM at the low level.

Then, the driving current Id is generated according to the voltage difference between the gate voltage of the gate electrode G1 of the driving transistor T1 and the driving voltage ELVDD. And the driving current Id is supplied to the OLED through the light emission control transistor T6. For the light emission period, the gate-source voltage Vgs of the driving transistor T1 is maintained to '(Dm+Vth)-ELVDD' by the storage capacitor Cst, and according to a current-voltage relationship of the driving transistor T1, the driving current Id is substantially proportional to the square '(Dm-ELVDD)' of a value obtained by subtracting the threshold voltage from the driving source-gate voltage. Accordingly, the driving current Id is determined regardless of the threshold voltage Vth of the driving transistor T1.

In this case, the bypass thin film transistor T7 receives the bypass signal Sn+1 from the bypass control line 158. Accordingly, a part of the driving current Id is discharged through the bypass transistor T7 at a bypass current Ibp.

Even in the case where a minimum current of the driving transistor T1 displaying a black image flows as the driving current, when the OLED emits light, the black image is not displayed well.

Accordingly, the bypass thin film transistor T7 of the OLED display according to the exemplary embodiment may distribute a part of the minimum current of the driving transistor T1 as the bypass current Ibp to another current path other than the current path of the OLED side. Here, the minimum current of the driving transistor T1 means a current under a condition in which the driving transistor T1 is turned off because the gate-source voltage Vgs of the driving transistor T1 is less than the threshold voltage Vth. The minimum driving current (for example, a current of about 10 pA or less) under the condition in which the driving transistor T1 is turned off is transferred to the OLED to be displayed as an image with black luminance. When the minimum driving current expressing the black image flows, an influence on a bypass transfer of the bypass current Ibp is large, but when a large driving current expressing an image such as a normal image or a white image flows, there may be little influence on the bypass current Ibp. Accordingly, when the driving current displaying a black image flows, the emission current Ioled of the OLED which is reduced by the current amount of the bypass current Ibp which flows out from the driving current Id through the bypass thin film transistor T7 has a minimum current amount as a level which may exactly display the black image. Therefore, a black luminance image is exactly implemented by using the bypass transistor T7, thereby improving a contrast ratio. In FIG. 2, the bypass signal BP is the same as the previous scan signal Sn−1, but is not necessarily limited thereto.

Hereinafter, a detailed structure of the OLED display illustrated in FIGS. 1 and 2 will be described in detail with reference to FIGS. 3, 4, 5, and 6.

Figure 3:
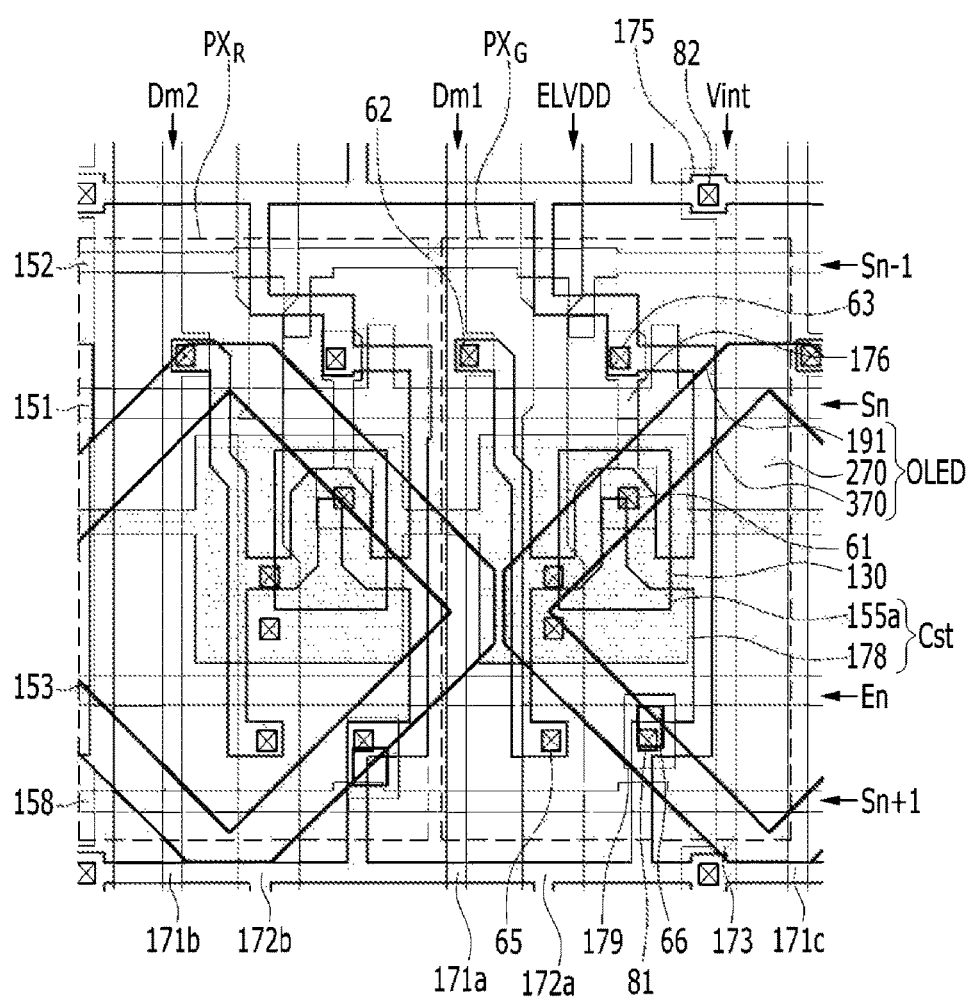
FIG. 3 is a diagram schematically illustrating a plurality of transistors and capacitors in the OLED display according to the exemplary embodiment.
Figure 4:
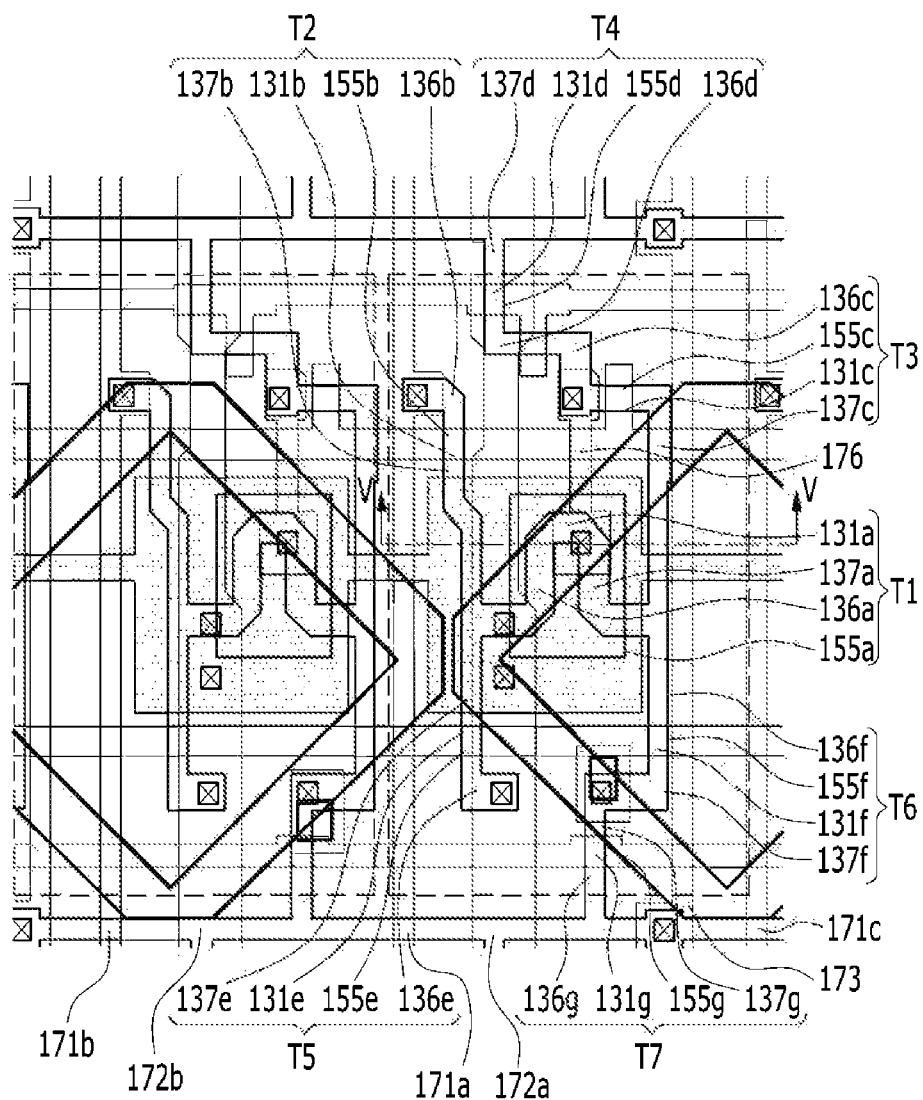
FIG. 4 is a detailed layout view of FIG. 3.
Figure 5:
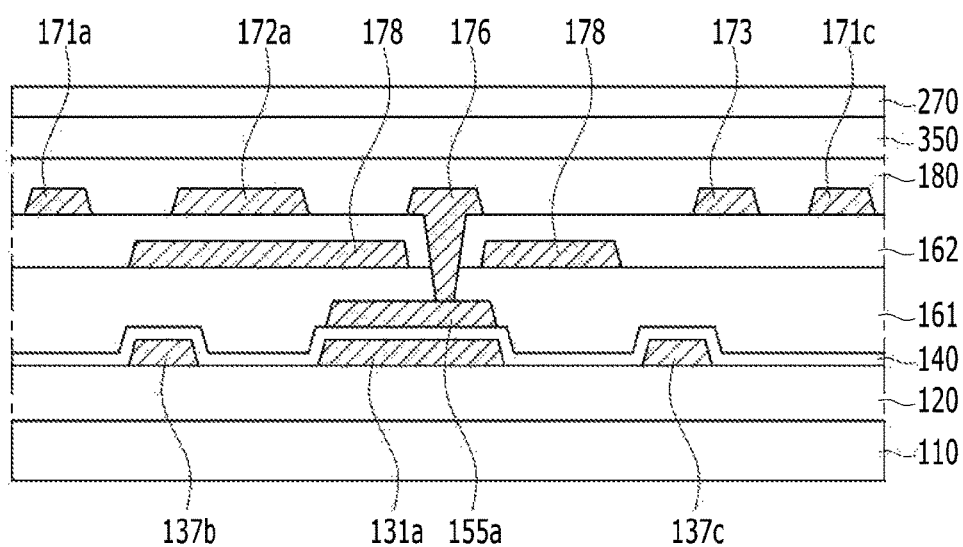
FIG. 5 is a cross-sectional view of the OLED display of FIG. 4 taken along line V-V.

FIG. 3 is a diagram schematically illustrating a plurality of transistors and capacitors in the OLED display according to the exemplary embodiment. FIG. 4 is a detailed layout view of FIG. 3. In addition, FIG. 5 is a cross-sectional view of the OLED display of FIG. 4 taken along line V-V.

Hereinafter, a detailed planar structure of the OLED display according to the exemplary embodiment will be first described in detail with reference to FIGS. 3 and 4 and a detailed cross-sectional structure will be described in detail with reference to FIGS. 5, 6, and 7.

As illustrated in FIGS. 3 and 4, the OLED display according to the exemplary embodiment includes a scan line 151, the previous scan line 152, the light emission control line 153, and the bypass control line 158 which are formed in a row direction. The OLED display also includes the data line 171 and the driving voltage line 172, and a plurality of pixels PXG and PXR.

The scan line 151, the previous scan line 152, the light emission control line 153, and the bypass control line 158 are formed in the row direction, and respectively apply a scan signal Sn, a previous scan signal Sn−1, a light emission control signal EM, and a bypass signal Sn+1.

The data line 171 and the driving voltage line 172 cross the scan line 151, the previous scan line 152, the light emission control line 153, and the bypass control line 158 and apply a data signal Dm and a driving voltage ELVDD to the pixels PXG and PXR.

In addition, the pixels PXG and PXR are formed at a point where the scan line 151 and the data line 171 cross each other and emits light by signals transferred from the scan line 151 and the data line 171.

The pixels PXG and PXR include a first pixel PXG and a second pixel PXR which are disposed to be adjacent to each other. For example, the first pixel PXG is a green light emission pixel emitting green light, and the second pixel PXR is a red light emission pixel emitting red light.

The OLED display according to the exemplary embodiment may be formed in a stripe type which is disposed in the order of a red light emission pixel R, a green light emission pixel G, a blue light emission pixel B, and a red light emission pixel R or in a pantile type which is disposed in the order of a red light emission pixel R, a green light emission pixel G, a blue light emission pixel B, and a green light emission pixel G. However, the spirit of the described technology is not limited thereto, and pixels having different colors may be disposed in another order other than the aforementioned order.

The driving voltage line 172 is formed to be parallel with the data line 171.

In addition, the initialization voltage Vint is transferred to the compensation transistor T3 through the initialization transistor T4 from the initialization voltage line 173.

Further, in the first pixel PXG, the driving transistor T1, the switching transistor T2, the compensation transistor T3, the initialization transistor T4, the operation control transistor T5, the light emission control transistor T6, the bypass transistor T7, the storage capacitor Cst, and the OLED are formed.

The OLED is configured by a pixel electrode 191, an organic emission layer 370, and a common electrode 270. The compensation transistor T3 and the initialization transistor T4 may be configured by a dual gate structure transistor in order to block a leakage current.

Respective channels of the driving transistor T1, the switching transistor T2, the compensation transistor T3, the initialization transistor T4, the operation control transistor T5, the light emission control transistor T6, and the bypass transistor T7 are formed inside one semiconductor 130 connected, and the semiconductor 130 may be formed to be curved in various shapes. The semiconductor 130 may be formed of polysilicon or an oxide semiconductor. The oxide semiconductor may include any one of oxides based on titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are complex oxides thereof.

In the case where the semiconductor 130 is formed of the oxide semiconductor, in order to protect an oxide semiconductor material vulnerable to an external environment such as a high temperature, a separate passivation layer may be added.

The semiconductor 130 includes a channel which is channel-doped with an N-type impurity or a P-type impurity. The semiconductor 130 also includes a source doping region and a drain doping region which are formed at both sides of the channel and doped at a higher concentration than a doped concentration of the doping impurity doped on the channel. In the exemplary embodiment, the source doping region and the drain doping region correspond to the source electrode and the drain electrode, respectively. The source electrode and the drain electrodes formed in the semiconductor 130 may be formed by doping only the corresponding regions. Further, in the semiconductor 130, a region between source electrodes and drain electrodes of different transistors is doped and thus the source electrode and the drain electrode may be electrically connected to each other.

As illustrated in FIG. 4, the channel 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes a driving channel 131a, a driving gate electrode 155a, a driving source electrode 136a, and a driving drain electrode 137a.

The driving channel 131a is curved and may have a meandering shape or a zigzag shape. As such, the curved driving channel 131a is formed, and thus the driving channel 131a may be elongated in a narrow space. Accordingly, the driving range of the driving gate-source voltage Vgs between the driving gate electrode 155a and the driving source electrode 136a is increased by the elongated driving channel 131a. Since the driving range of the driving gate-source voltage Vgs is increased, grays of light emitted from the OLED may be more finely controlled by changing a magnitude of the driving gate-source voltage Vgs, and as a result, a resolution of the OLED display may be enhanced and display quality may be improved.

Various examples such as 'reverse S', 'S', 'M', and 'W' may be implemented by variously modifying the shape of the driving channel 131a.

The driving gate electrode 155a overlaps the driving channel 131a, and the driving source electrode 136a and the driving drain electrode 137a are formed to be adjacent to both sides of the driving channel 131a, respectively. The driving gate electrode 155a is connected to a driving connecting member (or driving connector) 176 through a first contact hole 61.

The switching transistor T2 includes a switching channel 131b, a switching gate electrode 155b, a switching source electrode 136b, and a switching drain electrode 137b. The switching gate electrode 155b which is a part extended from the scan line 151 overlaps the switching channel 131b, and the switching source electrode 136b and the switching drain electrode 137b are formed to be adjacent to both sides of the switching channel 131b, respectively. The switching source electrode 136b is connected to the data line 171 through a second contact hole 62.

The compensation transistor T3 includes a compensation channel 131c, a compensation gate electrode 155c, a compensation source electrode 136c, and a compensation drain electrode 137c. Two compensation gate electrodes 155c which are parts of the scan line 151 are formed in order to prevent a leakage current and overlap the compensation channel 131c. The compensation source electrode 136c and the compensation drain electrode 137c are formed to be adjacent to both sides of the compensation channel 131c, respectively.

The compensation drain electrode 137c is connected to the driving connecting member 176 through a third contact hole 63.

The initialization transistor T4 includes an initialization channel 131d, an initialization gate electrode 155d, an initialization source electrode 136d, and an initialization drain electrode 137d. Two initialization gate electrodes 155d which are parts of the scan line 152 are formed in order to prevent a leakage current and overlap the initialization channel 131d. The initialization source electrode 136d and the initialization drain electrode 137d are formed to be adjacent to both sides of the initialization channel 131d, respectively. The initialization source electrode 136d is connected to the initialization connecting member 175 through a fourth contact hole 64.

The operation control transistor T5 includes an operation control channel 131e, an operation control gate electrode 155e, an operation control source electrode 136e, and an operation control drain electrode 137e. The operation control gate electrode 155e which is a part of the light emission control line 153 overlaps the operation control channel 131e, and the operation control source electrode 136e and the operation control drain electrode 137e are formed to be adjacent to both sides of the operation control channel 131e, respectively. The operation control source electrode 136e is connected to the driving voltage line 172 through a fifth contact hole 65.

The light emission control transistor T6 includes a light emission control channel 131f, a light emission control gate electrode 155f, a light emission control source electrode 136f, and a light emission control drain electrode 137f. The light emission control gate electrode 155f which is a part of the light emission control line 153 overlaps the light emission control channel 131f, and the light emission control source electrode 136f and the light emission control drain electrode 137f are formed to be adjacent to both sides of the light emission control channel 131f, respectively. The light emission control drain electrode 137f is connected to a light emission control connecting member 179 through a sixth contact hole 66.

The bypass transistor T7 includes a bypass channel 131g, a bypass gate electrode 155g, a bypass source electrode 136g, and a bypass drain electrode 137g. The bypass gate electrode 155g which is a part of the bypass control line 158 overlaps the bypass channel 131g, and the bypass source electrode 136g and the bypass drain electrode 137g are formed to be adjacent to both sides of the bypass channel 131g, respectively.

The bypass source electrode 136g is directly connected to the light emission control drain electrode 137f, and the bypass drain electrode 137g is directly connected to the initialization source electrode 136d.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 178 which are disposed with an interlayer insulating layer 160 therebetween. The first storage electrode 155a corresponds to the driving gate electrode 155a, and the second storage electrode 178 is an extended region of the first driving voltage line 172a and formed one by one for every one pixel.

Here, the interlayer insulating layer 160 is a dielectric material, and a storage capacitance is determined by a voltage between the charge accumulated in the storage capacitor Cst and a voltage between both capacitor plates 155a and 156. As such, a space which may form a storage capacitor in a narrow space by the driving channel 131a having a large area in the pixel may be ensured by using the driving gate electrode 155a.

The first storage electrode 155a which is the driving gate electrode 155a is connected to the driving connecting member 176 through the first contact hole 61.

In this case, the first contact hole 61 passes through the second storage electrode 178 in an insulated state from the second storage electrode 178 to be connected to the first storage electrode 155a disposed to overlap the second storage electrode 178.

The driving connecting member 176 is formed on the same layer to be substantially parallel with the data line 171. The other end of the driving connecting member 176 is connected to the compensation drain electrode 137c of the compensation transistor T3 and the initialization drain electrode 137d of the initialization transistor T4 through the third contact hole 63.

For example, the driving connecting member 176 connects the driving gate electrode 155a, the compensation drain electrode 137c of the compensation transistor T3, and the initialization drain electrode 137d of the initialization transistor T4 to each other. The driving connecting member 176 corresponds to a gate node GN illustrated on the equivalent circuit diagram of FIG. 1.

The second storage electrode 178 is formed as an extension extended from the first driving voltage line 172a.

Accordingly, the storage capacitor Cst stores a storage capacitance corresponding to a difference between the driving voltage ELVDD transferred to the second storage electrode 178 through the driving voltage line 172 and the driving gate voltage Vg of the driving gate electrode 155a.

The data line 171 crosses the scan line 151 and extends in a column direction, and the driving voltage line 172 is spaced apart from the data line 171 to extend in a column direction.

The data line 171 includes a first data line 171a where the data signal Dm1 is transferred to the first pixel PXG, a second data line 171b where a next data signal Dm2 is transferred to the adjacent second pixel PXR, and a third data line 171c where the data signal is transferred to a third pixel (not illustrated) disposed at an opposite side of the second pixel PXR based on the first pixel PXG.

The first data line 171a and the second data line 171b are spaced apart from each other with the second driving voltage line 172b providing the driving voltage to the second pixel PXR.

A parasitic capacitor Ca is generated between the data line 171 and the driving connecting member 176, and the parasitic capacitor Ca allows the data signal Dm of the data line 171 and a change of the next data signal Dm+1 to influence the driving connecting member 176.

Accordingly, the driving gate voltage Vg of the driving gate electrode 155a connected to the driving connecting member 176 is changed to influence the luminance, and as a result, vertical crosstalk occurs.

In the exemplary embodiment, the initialization voltage line 173 are disposed between the driving connecting member 176 and the third data line 171c and the first driving voltage line 172a are disposed between the driving connecting member 176 and the first data line 171a, to minimize the parasitic capacitor between the data line 171 and the driving connecting member 176.

For example, the driving connecting member 176 is spaced apart from the third data line 171c with the initialization voltage line 173 therebetween. Further, the driving connecting member 176 is spaced apart from the first data line 171a with the first driving voltage line 172a therebetween.

For example, the driving connecting member 176, the first data line 171a, the second data line 171b, the initialization voltage line 173, and the first driving voltage line 172a are formed on the same layer.

In addition, the first data line 171a and the second data line 171b are spaced apart from each other with the second driving voltage line 172b therebetween. Similarly, the driving connecting member 176 and the second data line 171b are spaced apart from each other with the first driving voltage line 172a therebetween.

For example, the first data line 171a is spaced apart from the driving connecting member 176 of the first pixel PXG with the first driving voltage line 172a therebetween and spaced apart from the driving connecting member 176 of the first pixel PXG with the initialization voltage line 173 therebetween.

The initialization voltage line 173 and the driving voltage line 172 which are conductors to which the voltages are applied are disposed between the driving connecting member 176 and the data line 171 to reduce the parasitic capacitance between the driving connecting member 176 and the data line 171, thereby minimizing a change of the driving gate voltage Vg due to the data voltage and the vertical crosstalk due to the change of the driving gate voltage Vg.

Further, since the data voltage Dm may be increased by minimizing a kickback voltage due to the parasitic capacitor, the driving range of the driving gate-source voltage Vgs between the driving gate electrode 155a connected to the driving connecting member 176 and the driving source electrode 136a may be increased. Therefore, grays of light emitted from the OLED may be more finely controlled, and as a result, a resolution of the OLED display may be enhanced and display quality may be improved.

In the exemplary embodiment, for example, the driving connecting member 176 of the first pixel PXG which is the green light emission pixel is disposed between the initialization voltage line 173 and the first driving voltage line 172a, and the driving connecting member of the second pixel PXR which is the red light emission pixel is disposed between the first data line 171a and the second driving voltage line 172b.

The driving connecting member of the second pixel PXR is disposed between the first data line 171a and the second driving voltage line 172b, and as a result, vertical crosstalk may occur in the second pixel PXR by the data signal Dm applied to the first data line 171a.

However, since the luminance of the first pixel PXG which is the green light emission pixel occupies about 70% or more of the luminance of all pixels including the red, blue, and green light emission pixels, in pixels having other colors except for the green light emission pixel, even though the vertical crosstalk occurs, in the entire OLED display, the effect of the vertical crosstalk is very little.

In the exemplary embodiment, in only some color pixels, the driving connecting member is disposed between the initialization voltage line and the driving voltage line, but the driving connecting members of all the pixels may be disposed between the initialization voltage line and the driving voltage line.

The light emission control connecting member 179 having a substantially quadrangular shape is connected to the pixel electrode 191 through a seventh contact hole 81, and the initialization connecting member 175 having a substantially quadrangular shape is connected to the initialization voltage line 173 through an eighth contact hole 82.

Hereinafter, a cross-sectional structure of the OLED display device according to the exemplary embodiment will be described in detail with reference to FIG. 5.

A buffer layer 120 is formed on the substrate 110. The substrate 110 is formed as an insulation substrate formed of glass, quartz, ceramic, plastic, or the like. The buffer layer 120 may serve to improve a characteristic of polysilicon by blocking impurities from the substrate 110 during a crystallization process for forming polysilicon and reduce stress applied to the semiconductor 130 formed on the buffer layer 120 by planarizing the substrate 110. The buffer layer 120 may be formed of silicon nitride (SiNx) or silicon oxide (SiO2).

The semiconductor 130 is formed with the channel 131 on the buffer layer 120 and includes the driving channel 131a, the switching channel 131b, the compensation channel 131c, the initialization channel 131d, the operation control channel 131e, the light emission control channel 131f, and the bypass channel 131g.

The driving source electrode 136a and the driving drain electrode 137a are formed at both sides of the driving channel 131a of the semiconductor 130, and the switching source electrode 136b and the switching drain electrode 137b are formed at both sides of the switching channel 131b. In addition, the compensation source electrode 136c and the compensation drain electrode 137c are formed at both sides of the compensation channel 131c, and the initialization source electrode 136d and the initialization drain electrode 137d are formed at both sides of the initialization channel 131d. In addition, the operation control source electrode 136e and the operation control drain electrode 137e are formed at both sides of the operation control channel 131e, and the light emission control source electrode 136f and light emission control drain electrode 137f are formed at both sides of the light emission control channel 131f. In addition, the bypass source electrode 136g and the bypass drain electrode 137g are formed at both sides of the bypass channel 131g.

The gate insulating layer 140 is formed on the semiconductor 130 to cover the semiconductor 130. On the gate insulating layer 140, the switching gate electrode 155b, the compensation gate electrode 155c, the initialization gate electrode 155d, the operation control gate electrode 155e, the light emission control gate electrode 155f, and the bypass gate electrode 155g, and gate lines 151, 152, 153, 158, and 155a including a driving gate electrode 155a (a first storage electrode) are formed.

The gate wires 151, 152, 153, 158, and 155a may include a multilayer in which metal layers formed of any one of copper (Cu), a copper alloy, aluminum (Al), an aluminum alloy, molybdenum (Mo), and a molybdenum alloy are formed.

A first interlayer insulating layer 161 covering the gate wires 151, 152, 153, 158, and 155a and the gate insulating layer 140 is formed on the gate wires 151, 152, 153, 158, and 155a and the gate insulating layer 140. The first interlayer insulating layer 161 may be formed of silicon nitride (SiNx), silicon oxide (SiO2), or the like.

In addition, the second storage electrode 178 overlapping the first storage electrode 155a is formed at an upper side of the first interlayer insulating layer 161, and a first contact hole 61 passing through the second storage electrode 178 and the first interlayer insulating layer 161 is formed. In this case, the first contact hole 61 passes through the second storage electrode 178 while being insulated from the second storage electrode 178.

The second interlayer insulating layer 162 covering the first interlayer insulating layer 161 and the second storage electrode 178 is formed on the first interlayer insulating layer 161 and the second storage electrode 178.

Since the detailed configuration of the second interlayer insulating layer 162 is substantially the same as the configuration of the first interlayer insulating layer 161, the detailed description thereof is omitted.

On the second interlayer insulating layer 162, the data wires 171, 172, 173, and 176 including the data line 171, the driving voltage line 172 connected to the second storage electrode 178, the driving connecting member 176, and the initialization voltage line 173 are formed.

The data wires 171, 172, 173, and 176 may include a multilayer in which metal layers formed of any one of copper (Cu), a copper alloy, aluminum (Al), an aluminum alloy, molybdenum (Mo), and a molybdenum alloy are formed. For example, may be formed by a triple layer of titanium/aluminum/titanium (Ti/Al/Ti), or a triple layer of molybdenum/aluminum/molybdenum (Mo/Al/Mo) or molybdenum/copper/molybdenum (Mo/Cu/Mo).

The driving connecting member 176 connected to the first storage electrode 155a among the data wires 171, 172, 173, and 176 is disposed between the first driving voltage line 172a and the initialization voltage line 173 to minimize the crosstalk due to the parasitic capacitance with the data line 171.

One end of the driving connecting member 176 is connected to the first storage electrode 155a through the first contact hole 61 passing through the interlayer insulating layer 160 and the second storage electrode 178. In addition, the other end of the driving connecting member 176 is connected to the compensation drain electrode 137c and the initialization drain electrode 137d through the third contact hole 63 formed in the gate insulating layer 140 and the interlayer insulating layer 160.

A passivation layer 180 covering the data wires 171, 172, 173, and 176 and the second interlayer insulating layer 162 is formed on the data wires 171, 172, 173, and 176 and the second interlayer insulating layer 162.

Since the passivation layer 180 covers and planarizes the data wires 171, 172, 173, and 176, the pixel electrode 191 may be formed on the passivation layer 180 without a step.

The passivation layer 180 may be formed of an organic material such as polyacrylates resin and polyimides resin, a formed layer formed of an organic material and an inorganic material, or the like.

The pixel electrode 191 and the initialization voltage line 173 are formed on the passivation layer 180.

A pixel defined layer PDL 350 covering the passivation layer 180, the initialization voltage line 173, and an edge of the pixel electrode 191 is formed on the passivation layer 180, the initialization voltage line 173, and an edge of the pixel electrode 191. The pixel defined layer 350 may be formed of an organic material such as polyacrylates resin and polyimides resin or a silica-based inorganic material.

An organic emission layer 370 is formed on the pixel electrode 191 and a common electrode 270 is formed on the organic emission layer 370. The common electrode 270 is also formed on the pixel defined layer 350 to be formed over the plurality of pixels PX. As such, the OLED including the pixel electrode 191, the organic emission layer 370, and the common electrode 270 is formed.

Here, the pixel electrode 191 is an anode which is a hole injection electrode, and the common electrode 270 is a cathode which is an electron injection electrode. However, the exemplary embodiment is not limited thereto, and according to a driving method of the OLED display, the pixel electrode 191 may be the cathode, and the common electrode 270 may be the anode. The hole and electron are injected into the organic emission layer 370 from the pixel electrode 191 and the common electrode 270, respectively, and an exciton generated by coupling the injected hole and electron falls down from an excited state to a ground state to emit light.

The organic emission layer 370 may be formed of a low-molecular organic material or a high-molecular organic material such as poly 3,4-ethylenedioxythiophene (PEDOT). Further, the organic emission layer 370 may be formed by a multilayer including one or more of a light emission layer, a hole injection layer (HIL), a hole transporting layer (HTL), an electron transporting layer (ETL), and an electron injection layer (EIL). In the case where the organic emission layer 370 includes all the layers, the HIL is disposed on the pixel electrode 191 which is the anode, and the HTL, the light emitting layer, the ETL, and the ETL are sequentially formed thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a colored image.

Further, in the organic emission layer 370, all of the red organic emission layer, the green organic emission layer, and the blue organic emission layer are together formed on the red pixel, the green pixel, and the blue pixel, and a red color filter, a green color filter, and a blue color filter are formed for each pixel, thereby implementing a color image. As another example, white organic emission layers emitting white light are formed on all of the red, green, and blue pixels. And a red color filter, a green color filter, and a blue color filter are formed for each pixel, thereby implementing the colored image. In the case of implementing the color image by using the white organic emission layers and the color filters, it is not required to use a deposition mask for depositing the red organic emission layer, the green organic emission layer, and the blue organic emission layer on respective pixels, for example, the red pixel, the green pixel, and the blue pixel.

The white organic emission layer described in another example may be formed by one organic emission layer, and also includes a configuration formed so as to emit white light by forming a plurality of organic emission layers. For example, the white organic emission layer includes a configuration which may emit white light by combining at least one yellow organic emission layer and at least one blue organic emission layer, a configuration which may emit white light by combining at least one cyan organic emission layer and at least one red organic emission layer, a configuration which may emit white light by combining at least one magenta organic emission layer and at least one green organic emission layer, and the like.

A encapsulation member (not illustrated) protecting the OLED may be formed on the common electrode 270, and the encapsulation member may be sealed on the substrate 110 by a sealant and formed of various materials including glass, quartz, ceramic, plastic, and metal. A thin film encapsulation layer may be formed by depositing an inorganic layer and an organic layer on the common electrode 270 without using the sealant.

In the exemplary embodiment, it is described that the first pixel PXG is the green light emission pixel and the second pixel PXR is the red light emission pixel. According to the layout and the luminance of the pixel, the first pixel PXG and the second pixel PXR may be configured by other color light emission pixels other than green and red, for example, the first pixel is formed as the red or blue light emission pixel, and the second pixel is formed as the blue or green light emission pixel.

Hereinafter, an OLED display according to another exemplary embodiment will be described in detail with reference to the accompanying drawings.

Figure 6:
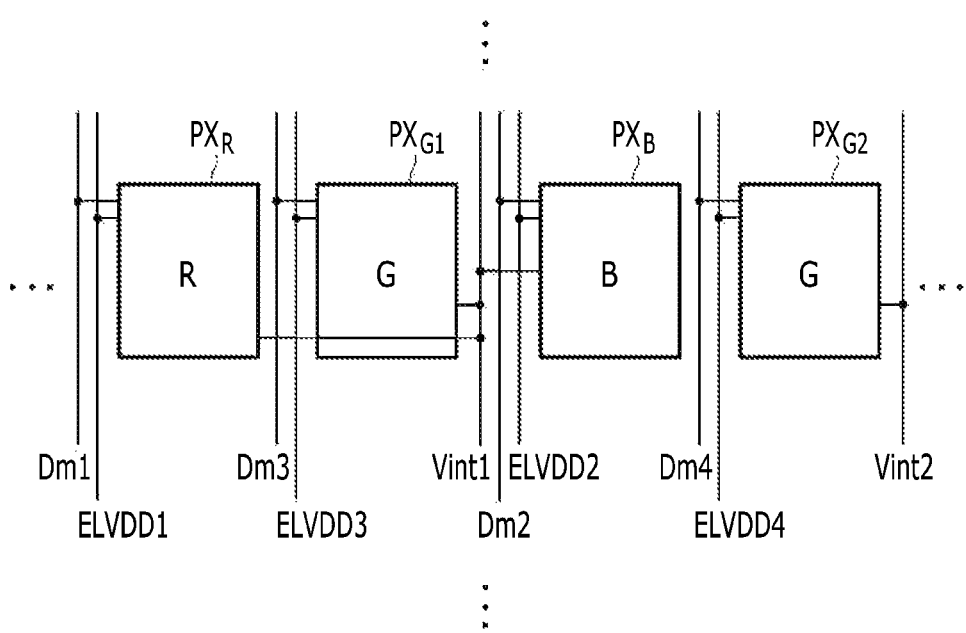
FIG. 6 is a diagram illustrating a schematic configuration of an OLED display according to another exemplary embodiment.

FIG. 6 is a diagram illustrating a schematic configuration of an OLED display according to another exemplary embodiment.

Referring to FIG. 6, the OLED display according to the exemplary embodiment includes a first pixel PXR, a second pixel PXB, and a third pixel PXG1 emitting light having different colors, a fourth pixel PXG2 emitting the same color as the third pixel PXG1, data lines Dm1, Dm2, Dm3, and Dm4, voltage lines ELVDD1, ELVDD2, ELVDD3, and ELVDD4, and initialization voltage lines Vint1 and Vint2.

The third pixel PXG1 is disposed between the first pixel PXR and the second pixel PXB. In addition, the fourth pixel PXG2 is spaced apart from the third pixel PXG1 so that the second pixel PXB is disposed between the third pixel PXG1 and the fourth pixel PXG2.

In this case, the first pixel PXR is formed as the red light emission pixel, the second pixel PXB is formed as the blue light emission pixel, the third pixel PXG1 and the fourth pixel PXG2 are formed as the green light emission pixels.

For example, the OLED display according to the exemplary embodiment is formed as an OLED display with a pantile type in which red (R)-green (G)-blue (B)-green (G), for example, four light emission pixels are repetitively disposed.

The data lines Dm1, Dm2, Dm3, and Dm4 include a first data line Dm1, a second data line Dm2, a third data line Dm3, and a fourth data line Dm4.

The first data line Dm1, the second data line Dm2, the third data line Dm3, and the fourth data line Dm4 transfer a first data signal, a second data signal, a third data signal, and a fourth data signal to the first pixel PXR, the second pixel PXB, the third pixel PXG1, and the fourth pixel PXG2, respectively.

In addition, the driving voltage lines ELVDD1, ELVDD2, ELVDD3, and ELVDD4 include a first driving voltage line ELVDD1, a second driving voltage line ELVDD2, a third driving voltage line ELVDD3, and a fourth driving voltage line ELVDD4 which transfer driving voltages to the first pixel PXR, the second pixel PXB, the third pixel PXG1, and the fourth pixel PXG2.

The initialization voltage lines Vint1 and Vint2 include a first initialization voltage line Vint1 supplying an initialization voltage to the first pixel PXR, the second pixel PXB, and the third pixel PXG1 and a second initialization voltage line Vint2 supplying the initialization voltage to the fourth pixel PXG2.

In this case, the third driving voltage line ELVDD3 is disposed between the driving connecting member (not illustrated) included in the third pixel PXG1 and the third data line Dm3. The first initialization voltage line Vint1 is disposed between the driving connecting member of the third pixel PXG1 and the second data line Dm2. Therefore, it is possible to reduce the vertical crosstalk generated in the third pixel PXG1 by the data signals of the second data line Dm2 and the third data line Dm3 which are disposed at both sides of the third pixel PXG1.

Similarly, the third driving voltage line ELVDD3 is disposed between the driving connecting member of the fourth pixel PXG2 and the fourth data line Dm4, and the driving connecting member of the fourth pixel PXG2 is disposed between the fourth driving voltage line ELVDD4 and the second initialization voltage line Vint2.

In the exemplary embodiment, for convenience of description, the first pixel PXR, the second pixel PXB, the third pixel PXG1, and the fourth pixel PXG2 are spaced apart from the data lines Dm1, Dm2, Dm3, and Dm4 and the driving voltage lines ELVDD1, ELVDD2, ELVDD3, and ELVDD4, but a configuration in which parts of the first pixel PXR, the second pixel PXB, the third pixel PXG1, and the fourth pixel PXG2 overlap the data lines Dm1, Dm2, Dm3, and Dm4, the driving voltage lines ELVDD1, ELVDD2, ELVDD3, and ELVDD4, and the initialization voltage lines Vint1 and Vint2 is also included in the spirit of the described technology.

Figure 7:
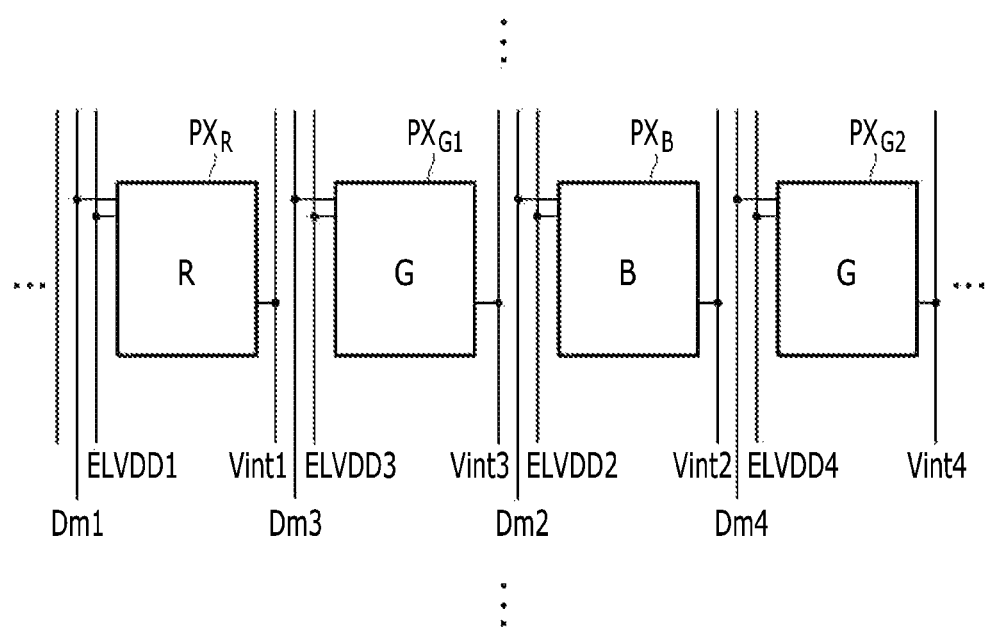
FIG. 7 is a diagram illustrating a schematic configuration of an OLED display according to yet another exemplary embodiment.

FIG. 7 is a diagram illustrating a schematic configuration of an OLED display according to yet another exemplary embodiment.

In the exemplary embodiment, since there is a difference in a position where the initialization voltage line is formed and other configurations are the same as the configurations of the OLED display of FIG. 6, hereinafter, features of the exemplary embodiment will be mainly described.

Referring to FIG. 7, the OLED display according to the exemplary embodiment includes a first pixel PXR, a second pixel PXB, and a third pixel PXG1 emitting light having different colors, a fourth pixel PXG2 emitting the same color as the third pixel PXG1, data lines Dm1, Dm2, Dm3, and Dm4, driving voltage lines ELVDD1, ELVDD2, ELVDD3, and ELVDD4, and initialization voltage lines Vint1, Vint2, Vint3, and Vint4.

The initialization voltage lines Vint1, Vint2, Vint3, and Vint4 include a first initialization voltage line Vint1, a second initialization voltage line Vint2, a third initialization voltage line Vint3, and a fourth initialization voltage line Vint4 which transfer initialization voltages to the first pixel PXR, the second pixel PXB, the third pixel PXG1, and the fourth pixel PXG2, respectively.

In this case, the driving connecting member of the first pixel PXR is disposed between the first driving voltage line ELVDD1 and the first initialization voltage line Vint1, the driving connecting member of the second pixel PXB is disposed between the second driving voltage line ELVDD2 and the second initialization voltage line Vint2, the driving connecting member of the third pixel PXG1 is disposed between the third driving voltage line ELVDD3 and the third initialization voltage line Vint3, and the driving connecting member of the fourth pixel PXG2 is disposed between the fourth driving voltage line ELVDD4 and the fourth initialization voltage line Vint4.

For example, the driving connecting members of all of the pixels PXR, PXB, PXG1, and PXG2 are spaced apart from each other with the data lines, the driving voltage line, and the initialization voltage line, thereby minimizing the vertical crosstalk due to the data signal transferred through the data line.

Figure 8:
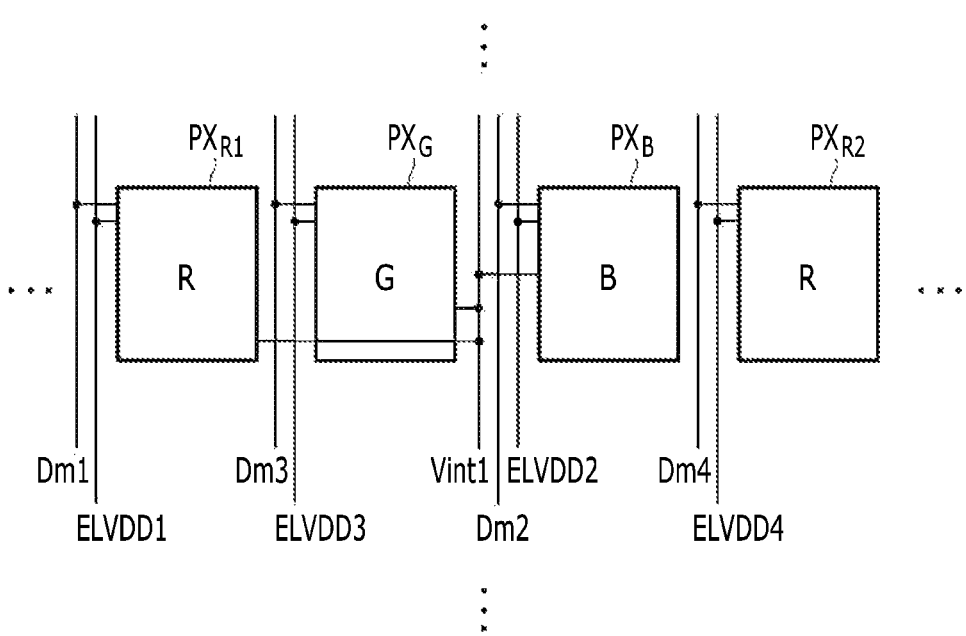
FIG. 8 is a diagram illustrating a schematic configuration of an OLED display according to still another exemplary embodiment.

FIG. 8 is a diagram illustrating a schematic configuration of an OLED display according to still another exemplary embodiment.

In the exemplary embodiment, since there is a difference in a configuration in which pixels are disposed and other configurations are the same as the configurations of the OLED display of FIG. 6, hereinafter, features of the exemplary embodiment will be mainly described.

Referring to FIG. 8, the OLED display according to the exemplary embodiment includes a first pixel PXR1, a second pixel PXB, and a third pixel PXG emitting light having different colors, a fourth pixel PXG2 emitting the same color as the first pixel PXR1, data lines Dm1, Dm2, Dm3, and Dm4, driving voltage lines ELVDD1, ELVDD2, ELVDD3, and ELVDD4, and initialization voltage lines Vint1 and Vint2.

The third pixel PXG is disposed between the first pixel PXR1 and the second pixel PXB. In addition, the fourth pixel PXR2 is spaced apart from the third pixel PXG so that the second pixel PXB is disposed between the third pixel PXG and the fourth pixel PXR2.

In this case, the first pixel PXR1 and the fourth pixel PXR2 are formed as the red light emission pixels, the second pixel PXB is formed as the blue light emission pixel, the third pixel PXG is formed as the green light emission pixel.

For example, the OLED display according to the exemplary embodiment is formed as an OLED display with a stripe type in which red (R)-green (G)-blue (B), for example, three light emission pixels are repetitively disposed.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
    a substrate;
    a plurality of scan lines formed over the substrate and configured to transfer a scan signal;
    a plurality of data lines crossing the scan lines and configured to transfer a plurality of data voltages;
    a driving voltage line crossing the scan lines and configured to transfer a driving voltage;
    an initialization voltage line crossing the scan lines and configured to transfer an initialization voltage; and
    a plurality of pixels formed where the scan lines and the data lines cross,
    wherein at least one of the pixels includes:
        a switching transistor electrically connected to the corresponding scan and data lines;
        a driving transistor electrically connected to the switching transistor and configured to receive the initialization voltage from the initialization voltage line;
        a driving connector electrically connected to a driving gate electrode of the driving transistor; and
        an OLED electrically connected to the driving transistor,
    wherein the driving connector is spaced apart from the data lines,
    wherein one of the initialization voltage line and the driving voltage line is interposed between the driving connector and the corresponding data line in a plane view,
    wherein the pixels includes a first pixel and a second pixel configured to emit light having different colors, and a third pixel formed between the first pixel and second pixel,
    wherein the driving voltage line is formed between the first and third pixels, and
    wherein the initialization voltage line is formed between the second and third pixels.

2. The OLED display of claim 1, wherein the data lines include first to third data lines configured to respectively transfer first to third data signals to the first to third pixels,
    wherein the driving voltage line is formed between the driving connector of the third pixel and the third data line, and
    wherein the initialization voltage line is formed between the driving connector of the third pixel and the second data line.

3. The OLED display of claim 1, further comprising a fourth pixel configured to emit light of the same color as the third pixel,
    wherein the second pixel is formed between the third and fourth pixels.

4. The OLED display of claim 3, wherein the data lines include first to fourth data lines configured respectively transfer first to fourth data signals to the first to fourth pixels,
wherein the driving voltage lines include first to fourth driving voltage lines configured to respectively transfer the driving voltage to the first to fourth pixels,
wherein the initialization voltage line includes first and second initialization voltage lines configured to respectively supply the initialization voltage to the third and fourth pixels,
wherein the third driving voltage line is formed between the driving connector of the third pixel and the third data line,
wherein the first initialization voltage line is formed between the driving connector of the third pixel and the second data line,
wherein the third driving voltage line is formed between the driving connector of the fourth pixel and the fourth data line, and
wherein the driving connector of the fourth pixel is formed between the fourth driving voltage line and the second initialization voltage line.

5. The OLED display of claim 1, further comprising a fourth pixel configured to emit light of the same color as the first pixel,
wherein the second pixel is formed between the third and fourth pixels.

6. The OLED display of claim 1, wherein one of the first and second pixels includes a red light emission pixel, wherein the other pixel includes a blue light emission pixel, and wherein the third pixel is a green light emission pixel.

7. The OLED display of claim 1, wherein the pixels includes first and second pixels configured to emit light having different colors, and a third pixel formed between the first and second pixels,
wherein the driving voltage lines include first to third driving voltage lines configured to respectively supply the driving voltage to the first to third pixels,
wherein the data lines include first to third data lines configured to respectively supply the first to third data voltages to the first to third pixels,
wherein the initialization voltage lines include first to third initialization voltage lines configured to respectively supply the initialization voltage to the first to third pixels,
wherein the driving connector of the first pixel is formed between the first driving voltage line and the first initialization voltage line, wherein the driving connector of the second pixel is formed between the second driving voltage line and the second initialization voltage line, and wherein the driving connector of the third pixel is formed between the third driving voltage line and the third initialization voltage line.

8. The OLED display of claim 1, wherein the driving connector, the initialization voltage line, the driving voltage line, and the data lines are formed on the same layer.

9. The OLED display of claim 8, wherein the driving connector is formed between the initialization voltage line and the driving voltage line.

10. The OLED display of claim 1, further comprising:
a gate insulating layer formed over the substrate;
a first storage electrode formed over the gate insulating layer and configured to function as a gate electrode of the driving transistor;
a first interlayer insulating layer covering the gate insulating layer and the first storage electrode;
a second storage electrode formed over the first interlayer insulating layer and overlapping the first storage electrode in the depth dimension of the OLED display; and
a second interlayer insulating layer covering the second storage electrode and the first interlayer insulating layer,
wherein the driving connector, the initialization voltage line, and the driving voltage line are formed over the second interlayer insulating layer.

11. The OLED display of claim 10, wherein the driving connector is electrically connected to the first storage electrode via a contact hole passing through the second storage electrode, and wherein the driving connector is electrically insulated from the second storage electrode.

12. The OLED display of claim 1, further comprising a compensation transistor configured to compensate a threshold voltage of the driving transistor and electrically connected to the driving drain electrode of the driving transistor,
wherein the driving connector is configured to electrically connect the compensation drain electrode of the compensation transistor to the driving gate electrode.

13. The OLED display of claim 1, further comprising a semiconductor formed over the substrate and including a switching channel of the switching transistor and a driving channel of the driving transistor which are spaced apart from each other,
wherein the driving channel overlaps the driving gate electrode in the depth dimension of the OLED display, and
wherein the driving channel is non-linear.

14. An organic light-emitting diode (OLED) display, comprising:
a plurality of pixels;
a data line formed adjacent to the pixels and configured to transfer a data voltage;
a driving voltage line formed substantially parallel to the data line and configured to transfer a driving voltage; and
an initialization voltage line formed substantially parallel to the data line and configured transfer an initialization voltage;
wherein at least one of the pixels includes:
a driving transistor including a driving gate electrode and configured to receive the initialization voltage from the initialization voltage line;
a driving connector spaced apart from the data line and electrically connected to the driving gate electrode; and
an OLED electrically connected to the driving transistor,
wherein at least one of the initialization voltage line and the driving voltage line is interposed between the driving connector and the data line in a plane view,
wherein the pixels includes a first pixel and a second pixel configured to emit light having different colors, and a third pixel formed between the first pixel and second pixel,
wherein the driving voltage line is formed between the first and third pixels, and
wherein the initialization voltage line is formed between the second and third pixels.

15. The OLED display of claim 14, wherein the data line includes first to third data lines substantially parallel to each other, and wherein the initialization voltage line is interposed between the driving connector and the third data line.

16. The OLED display of claim 15, wherein the driving voltage line is interposed between the driving connector and the first data line.

17. The OLED display of claim 16, wherein the driving connector, the first data line, and the initialization voltage line are spaced apart from one another.

18. The OLED display of claim 17, wherein the driving connector, the third data line, and the driving voltage line are spaced apart from one another.

* * * * *